(12) United States Patent
Sarihan et al.

(10) Patent No.: US 6,930,032 B2
(45) Date of Patent: Aug. 16, 2005

(54) UNDER BUMP METALLURGY STRUCTURAL DESIGN FOR HIGH RELIABILITY BUMPED PACKAGES

(75) Inventors: Vijay Sarihan, Paradise Valley, AZ (US); Owen Fay, Gilbert, AZ (US); Lizabeth Ann Keser, Chandler, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 160 days.

(21) Appl. No.: 10/145,500

(22) Filed: May 14, 2002

(65) Prior Publication Data

US 2003/0214036 A1 Nov. 20, 2003

(51) Int. Cl.$^7$ ............................................. H01L 21/44
(52) U.S. Cl. ................................................ 438/614
(58) Field of Search ................................. 438/612–614

(56) References Cited

U.S. PATENT DOCUMENTS

| | | | |
|---|---|---|---|
| 5,904,859 A | 5/1999 | Degani | 216/18 |
| 5,937,320 A * | 8/1999 | Andricacos et al. | 438/614 |
| 6,107,180 A | 8/2000 | Munroe et al. | 438/613 |
| 6,117,759 A | 9/2000 | Greer et al. | 438/616 |
| 6,130,141 A | 10/2000 | Degani et al. | 438/455 |
| 6,268,114 B1 | 7/2001 | Wen et al. | 430/314 |
| 6,282,100 B1 | 8/2001 | Degani et al. | 361/760 |
| 6,312,974 B1 | 11/2001 | Wu et al. | 438/107 |
| 6,372,622 B1 | 4/2002 | Tan et al. | 438/612 |
| 6,376,354 B1 | 4/2002 | Yih | 438/613 |
| 6,413,851 B1 * | 7/2002 | Chow et al. | 438/613 |
| 2002/0027269 A1 | 3/2002 | Hashimoto | 257/669 |

FOREIGN PATENT DOCUMENTS

| | | | |
|---|---|---|---|
| EP | 1 154 471 A1 | 11/2001 | H01L/21/60 |
| JP | 2001057374 | 2/2001 | H01L/21/60 |
| WO | 01/56081 | * 8/2001 | |

OTHER PUBLICATIONS

Suwanna Jittinorasett, "UBM Formation on Single Die/Dice for Flip Chip Applications," Master's Thesis, Virginia Polytechnic Institute, Aug. 25, 1999.
John Y. Xie et al., "Take a Closer Look at High Pin Count Flip Chip BGA," Altera Corporation, Sep. 14, 2000.
Juergen Wolf, "PbSn60 Solder Bumping by Electroplating," Fraunhofer IZM, Berlin, Germany, Pixel 2000, Geneva, Jun. 5–8, 2000.
ASE Group, "Wafer Bumping & Flip Chip," 2 pgs.
Dominick Richiuso, "Chip Scale Integrated Passive Devices for Wireless Applications," IIC Taipei Conference Proceedings, pp. 33–34.
Steven Beerten et al., "Flip–Chip Redistribution Using Stencilprinted Bumps," Interuniversity Micro–Electronics Centre, Leuven, Belgium.
Warren W. Flack et al., "Characterization Study of an Aqueous Developable Photosensitive Poliymide on 300 mm Wafers," SPIE 2001 #4346–96, pp. 1–11.

* cited by examiner

*Primary Examiner*—David A. Zarneke
(74) *Attorney, Agent, or Firm*—John A. Fortkort; Fortkort Grether & Kelton LLP

(57) ABSTRACT

A method for creating an under bump metallization layer (37) is provided. In accordance with the method, a die (33) is provided which has a die pad (35) disposed thereon. A photo-definable polymer (51 or 71) is deposited on the die pad, and an aperture (66) is created in the photo-definable polymer. Finally, an under bump metallization layer (37) is deposited in the aperture. A die package is also provided comprising a die having a die pad (35) disposed thereon, and having an under bump metallization layer (37) disposed on the die pad. The structure has a depression or receptacle (57) therein and has a thickness of at least about 20 microns.

17 Claims, 9 Drawing Sheets

UNDER BUMP METALLURGY STRUCTURAL DESIGN FOR HIGH RELIABILITY BUMPED PACKAGES

FIELD OF THE INVENTION

The present invention relates generally to the formation of solder joints, and more particularly to under bump metallurgy structural designs, and their methods of production, which can be used to improve the integrity of solder joints.

BACKGROUND OF THE INVENTION

The use of solder bumps in attaching die to flip-chip packaging is well known in the art. FIG. 1 and FIG. 2 (the later of which is a magnified view of REGION 2 of FIG. 1) illustrate one prior art configuration 10 that can be used for this purpose. As shown therein, a die 11 is provided which has an I/O pad or die pad 13 disposed thereon. A photo polymer passivation layer 17 is provided to protect the die from damage during processing. An Under Bump Metallurgy (UBM) structure 15 is disposed on the die pad, and a solder ball 19 is placed or formed on top of the UBM structure. The solder ball is used to form an electrical and mechanical connection between the die and a Printed Circuit Board (PCB) 21 or other device.

One issue of concern in flip chip packaging, and indeed in devices utilizing solder die attach in general, is solder fatigue. In a typical device, a solder ball provides a joint between two substrates, such as a die and a PCB, that have differing coefficients of thermal expansion. Consequently, varying amounts of stress and strain are applied to the joints as the device is exposed to thermal cycles. Moreover, residual stresses typically exist across the solder joint even at normal operating temperatures, as a result of the process used to form the joint. Over time, these forces can cause the solder joint to crack, which may result in mechanical and/or electrical failure of the joint.

A number of efforts have been made in the art to reduce solder joint fatigue in these devices. For example, some devices have been made in which the two substrates joined across a ball grid array are made to have similar coefficients of thermal expansion, thus reducing the amount of stress and strain on the solder joint attendant to thermal cycling. However, this approach places severe material design constraints on the overall device, and is thus impractical for many applications.

Other approaches have focused on solder ball compositions or constructions which are better able to withstand the stress and strain accompanying thermal cycling. While some of these approaches have indeed improved solder joint life, the rate of solder joint failure in flip chip devices is still too high.

In some constructions, a Stress Compensation Layer (SCL) is provided around the solder joint to provide additional mechanical integrity to the package. In theory, the SCL acts to hinder some stress-related solder joint failure mechanisms, thus improving the life of the package. In reality, however, adhesion between the solder and the SCL is often very poor, so that the benefits of the SCL layer are not fully realized (e.g., the SCL does not act effectively as a stress compensation layer). Moreover, the SCL is conventionally applied after solder ball placement. In order for die attach to be implemented, this typically requires a grinding operation to remove the SCL that has accumulated on top of the solder balls. Thus, in one commonly used manufacturing scheme, grinding is used to expose the solder bumps, after which a second solder bump is disposed on the first solder bump to achieve die attach. However, the step of adding an additional solder ball, and especially the step of grinding, are very undesirable and add cost, complication, and yield issues to the package manufacturing process.

In some suggested approaches, solder joints are reinforced after die attach by an underfill operation. This involves the application of an adhesive between the die and a PCB after die attach is implemented. The laminar flow of adhesive between the two structures is facilitated by capillary action. Because the adhesive forms an additional load-bearing structure between the die and the package, stresses on the solder joint are alleviated somewhat, and the life of the package may be increased. However, underfill operations are very undesirable because they require the end user to perform additional steps in the die attach process. Due to the extreme price sensitivities of chip product manufacturing, the additional costs and throughput issues associated with an underfill operation make it an economically unfeasible option for many applications. Moreover, the underfill operation complicates the manufacturing process, reduces yields and, when it is performed by the end user and not the chip manufacturer, presents quality control issues. Also, the use of an underfill leads to a device which is not reworkable. However, many applications involve the attachment of a plurality of chips to a PCB. Hence, if the multi-chip device is not reworkable, a defect in any one of the chips will require that the entire device be discarded.

SUMMARY OF THE INVENTION

One significant factor affecting solder joint life is the Under Bump Metallization (UBM) structure employed in conjunction with the solder joint. To date, however, relatively little consideration has been given to the development of UBM structures that promote solder joint reliability. Rather, existing UBM schemes have been designed to optimize metallurgical or processing parameters rather than to improve the reliability of solder joints. Also, little thought has been given to UBM schemes which facilitate solder ball placement. As a result, many existing UBM structures not only do not facilitate solder ball placement, but actually hinder or complicate it.

There is thus a need in the art for a UBM structure that promotes solder joint reliability. There is also a need in the art for a UBM structure that facilitates solder ball placement and enhances the integrity of the solder ball joint. There is further a need in the art for a solder joint design in which the solder forms a strong bond, either directly or through intermediate layers or structures, to any surrounding Stress Compensation layer (SCL). There is also a need in the art for methods for making the above noted structures, and for using these structures in the formation of a solder ball joint. These and other needs are met by the various structures and methodologies described herein.

In one aspect, a method is provided herein for creating a UBM layer or structure. A UBM layer or structure made in accordance with the method is also disclosed. The method comprises the steps of providing a die having a die pad disposed thereon, depositing a photo-definable polymer on the die pad, creating an aperture in the photo-definable polymer, and depositing a UBM layer onto the surfaces of the SCL. The photo-definable polymer may be, for example, an epoxy which is filled with borosilicate glass, quartz, silica, or glass beads. The coefficient of thermal expansion of the photo-definable polymer can be manipulated (for example, through suitable choice and amount of filler) so that it closely matches that of the die substrate, thus allowing the photo-definable polymer to act as a stress compensation layer. Moreover, since the polymer is photo-definable, it can be masked and exposed to create a hole or aperture of almost any desired shape or dimensions, which can be utilized in a subsequent metal deposition process to form a UBM layer having a desired configuration. Such UBMs may be, for example, bowl-shaped or stud-shaped.

In another aspect, a die package is disclosed herein, as is a method for making such a die package. The package comprises a die having a die pad disposed thereon, and a UBM structure disposed on the die pad. The UBM structure has a depression or receptacle therein. The UBM has a thickness of greater than about 20 microns, preferably greater than about 25 microns, more preferably greater than about 45 microns, even more preferably within the range of about 45 microns to about 75 microns, and most preferably within the range of about 55 microns to about 65 microns. By comparison, prior art UBM devices typically have a minimum (and indeed maximum) thickness of less than a couple microns. The additional thickness of UBM structure is found to have a profound effect on package reliability and lifetime. The die package may also include an SCL, which will typically have a thickness within the range of about 5 to about 350 microns, preferably within the range of about 10 to about 100 microns, more preferably within the range of about 20 to about 60 microns, and most preferably within the range of about 30 to about 50 microns.

In another aspect, a UBM structure is provided, along with methods for making such a structure and using the structure in a solder ball joint. The UBM, which may be conveniently electroplated over the surfaces of an aperture formed in a photo-definable polymer of the type described above, is bowl-shaped, and terminates in a lip. A solder ball may be placed on top of the UBM so that, after reflow, the solder bump sits inside the UBM. This method of forming a solder bump provides for a large area of contact between the solder and the UBM, thus improving the solder-UBM bond. Moreover, through appropriate selection of the dimensions of the solder ball and the depression or receptacle in the UBM, the solder ball can be made to overlap the lip portion of the UBM upon reflow, thus providing a mechanical locking action which further improves the mechanical strength of the solder ball-UBM joint. With proper choice of materials for the solder ball and the UBM (for example, if the UBM comprises copper or a copper alloy and the solder ball comprises a tin-lead alloy), the materials of the solder ball and UBM can be made to diffuse into each other, thus further strengthening the bond between them.

In still another aspect, a metal primer layer is provided, as is a method for using such a primer layer in the formation of a UBM. The primer layer, which may comprise, for example, a layer of TiW with a layer of Cu disposed thereon, facilitates adhesion of the UBM to the SCL. The material or materials used in the primer layer may also serve other functions, such as providing a seed layer or bus metal layer for electroplating operations used to form the UBM.

These and other aspects are described in further detail below.

DETAILED DESCRIPTION

A new Under Bump Metallization (UBM) layer is disclosed herein which is especially suitable for use with a Wafer Level Chip Scale Package (WLCSP). The UBM dramatically improves package lifetime, and also avoids the need for the end user of the package to perform inter-poser or underfill operations. Instead, die attach may be achieved through a simple solder reflow operation.

Figure 1:
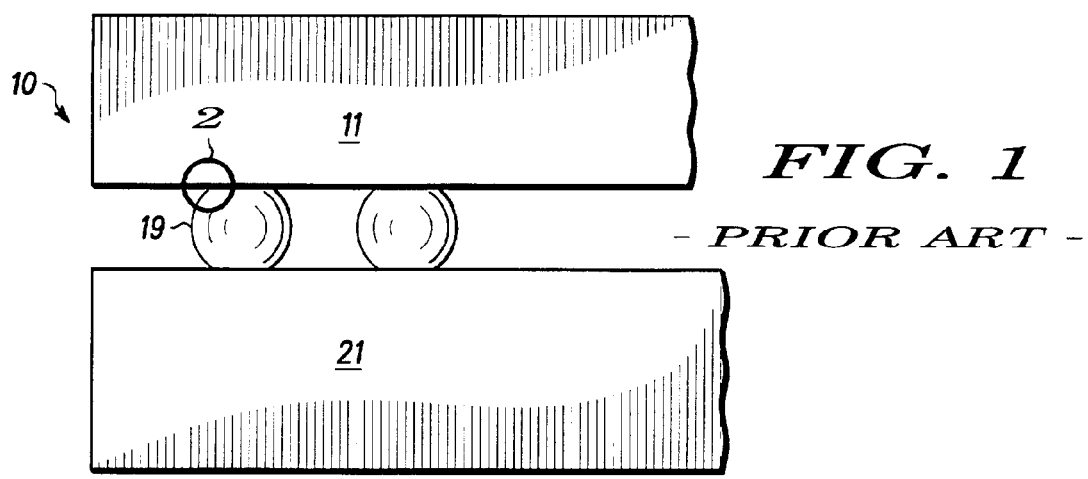
FIG. 1 is a cross-sectional illustration of a prior art solder ball die attach.
Figure 2:
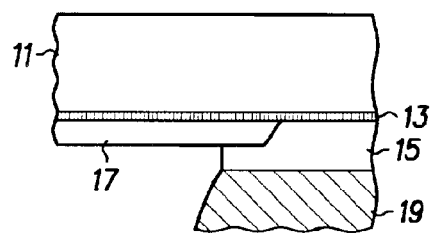
FIG. 2 is a cross-sectional illustration of REGION 2 of FIG. 1.
Figure 3:
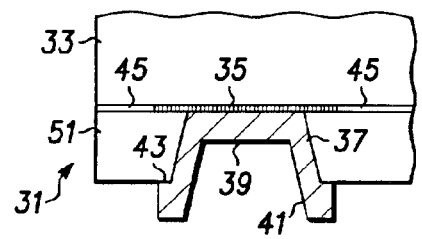
FIG. 3 is a cross-sectional illustration of a UBM in accordance with the teachings herein.

FIG. 3 is a simplified illustration depicting one embodiment of a chip scale package that may be made in accordance with some of the methods disclosed herein. The package 31 includes a die 33 which is equipped with an I/O pad or die pad 35 upon which is disposed a UBM 37. The UBM includes a bottom portion 39 and a sidewall portion 41. The sidewall portion terminates in a lip 43. A photo polymer passivation layer 45, which may comprise, for example, BenzoCycloButene (BCB) or another suitable material, is provided on the surface of the die adjacent to the die pad to protect the wafer from damage during processing. If necessary, photolithographical techniques or other suitable means may be utilized to expose the die pad prior to formation of the UBM. A Stress Compensation Layer (SCL) 51 is disposed on top of the passivation layer. Suitable materials and properties of SCLs are explained in greater detail below.

Figure 4:
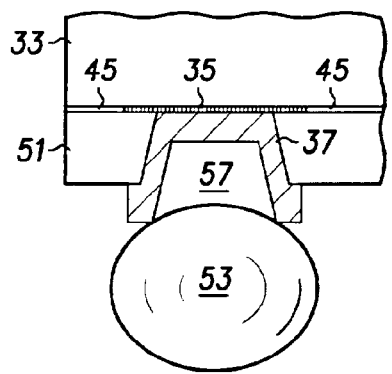
FIGS. 4 and 5 are cross-sectional diagrams illustrating the effect of solder ball reflow in a UBM structure of the type disclosed herein.
Figure 5:
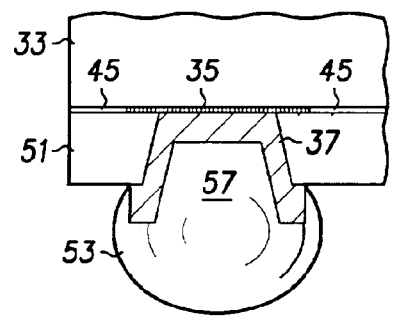

FIGS. 4–5 depict the placement of a solder ball on the UBM. As shown therein, the SCL 51, which is preferably a photo-definable epoxy, is formed on the passivation layer 45 and surrounds the UBM structure. A solder ball 53 is formed or placed on top of the UBM structure. As indicated in FIG. 5, the solder ball fills the depression or receptacle of the UBM structure upon reflow and overlaps the lip 54 of the UBM, thus locking the reflowed solder ball into place. One suitable sequence for fabricating a UBM structure of the type shown in FIGS. 4–5 is depicted in FIGS. 20–26.

Several features of the UBM structure depicted in FIGS. 4–5 deserve special mention. First of all, this UBM structure is much thicker than a conventional UBM structure. Typically, this UBM structure will have a minimum layer thickness (this may be measured as the thickness of the bottom portion of the UBM taken along a line perpendicular to the die pad) of greater than about 5 microns, preferably greater than about 25 microns, more preferably greater than about 45 microns, even more preferably within the range of about 45 microns to about 75 microns, and most preferably within the range of about 55 microns to about 65 microns. By comparison, prior art UBM structures typically have a minimum (and indeed maximum) thickness of less than a couple microns as measured along this axis. The additional thickness of the UBM structure disclosed herein is found to have a profound effect on package reliability and lifetime. It is to be noted that, in some applications, thicknesses in excess of 75 microns can also be used with beneficial results in the UBM structures disclosed herein. However, the additional costs associated with the extra materials and plating times is usually found to outweigh any further improvement in mechanical properties which may be achieved with thicknesses in excess of about 75 microns.

In addition to the above noted increase in layer thickness, the receptacle or cup 57 formed by the UBM structure depicted in FIGS. 4–5 is also deeper than is the case with a conventional UBM structure. Indeed, many conventional UBM structures lack such a receptacle or cup altogether. Typically, the depth of this receptacle, cup or depression (as measured along a line perpendicular to the bottom from a point on the line even with the lip of the receptacle) is at least about 40 microns, preferably at least about 60 microns, more preferably within the range of about 80 to about 120 microns, and most preferably about 100 microns, though this parameter may vary somewhat depending on the desired height and/or volume of the solder ball to be used in conjunction with the structure. The receptacle further improves the mechanical properties of the solder joint by providing a larger area of contact between the material of the UBM and the solder material, thus improving the integrity of the solder-UBM interface. This is especially true if the surface material of the UBM and the solder are capable of inter-reacting or diffusing into each other, as is the case, for example, if the surface of the UBM comprises copper and the solder is a tin-lead alloy. In such a case, the interdiffusion of these materials diminishes the likelihood of solder fatigue along the interface.

Figure 6:
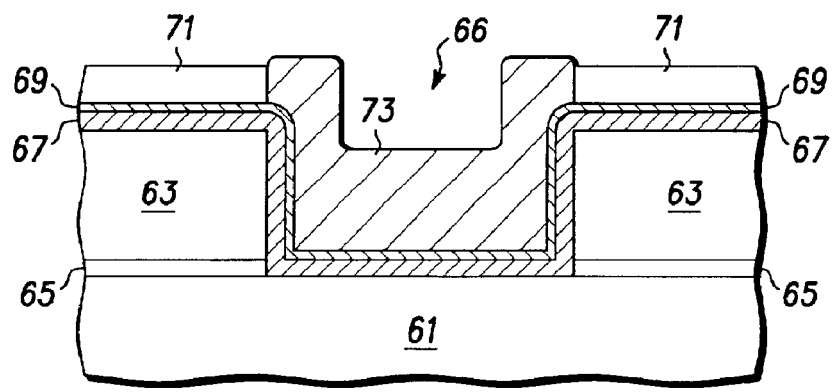
FIG. 6 is a cross-sectional diagram illustrating the formation of a UBM of the type disclosed herein.

FIG. 6 illustrates one particular, non-limiting example of a process which may be used to make a UBM structure on a silicon wafer 61 or other such substrate in accordance with the teachings herein. FIG. 6 also illustrates one possible structure which can be made in accordance with this process. In accordance with this process, a Stress Compensation Layer (SCL) 63 is deposited onto an existing passivation layer 65, the later of which may comprise, for example, BCB. The SCL will typically have a thickness within the range of about 5 to about 350 microns, preferably within the range of about 10 to about 100 microns, more preferably within the range of about 20 to about 60 microns, and most preferably within the range of about 30 to about 50 microns. The SCL will typically be an epoxy glass or other suitable material, and may be formed, for example, by a spin coat process or through other suitable methodologies. The SCL is preferably photo-definable so that a structure may be imparted to it through the use of photolithographic techniques, such as, for example, masking followed by exposure to a radiation source. The SCL is then photo-defined and cured in such a way that an opening 66 is formed which extends down to the silicon wafer (or the bonding pads thereof) and which has sidewalls and a bottom.

A thin layer of TiW 67 is sputtered onto the SCL and over the surfaces of the opening, and a thin layer of Cu 69 is sputtered onto the TiW layer. The combination of these two layers facilitates adhesion of the UBM to the SCL, and acts as a bus metal layer for electroplating. In a typical embodiment, the thickness of the sputtered TiW will be about 100 nm and the thickness of the sputtered Cu layer will be about 500 nm, though varying layer thicknesses may be used for each component.

Next, a layer of photo resist 71 is deposited and patterned about the opening to expose the metal layer. A relatively thick layer of copper 73 (e.g., about 60 microns thick, as measured along an axis perpendicular to the surface of the substrate and extending through a flat portion of the copper layer) is electroplated onto the unmasked portion of the substrate to form the UBM structure. The photo resist is then stripped in preparation for solder ball placement. Alternatively, if the photo resist is thick enough, the solder ball may be placed with the photo resist still intact, and the photo resist may be removed at a later point, as noted in reference to FIGS. 20–26. Typically, at some point after solder ball placement, the wafer is sent through a solder reflow oven so that the solder is brought into full contact with the surfaces of the UBM. This reflow may be part of the die manufacturing process, or may be performed by the end user as part of a die attach operation.

A method of the type described above is an "SCL first" approach, so called because the shape of the UBM is determined primarily by the SCL. However, a "photo first" approach (which is described later herein) may also be used in which the shape of the UBM is determined primarily by a photoresist. In either approach, one or more photodefinable polymers (which may be SCLs, photoresists, or combinations of the two) are used to selectively expose a portion of a bus metallization layer, or to control the deposition of the bus metallization layer so that it is selectively deposited in certain desired areas of the die substrate. The UBM may then be grown on the die substrate in a subsequent electroplating process. Since the UBM will only grow on the exposed portion of the bus metallization layer, the geometry of the UBM is ultimately determined by the geometry of the exposed bus metallization layer. Hence, UBMs having a wide variety of geometries may be produced in accordance with the teachings herein through the deposition and patterning of one or more photodefinable polymers.

Figure 7:
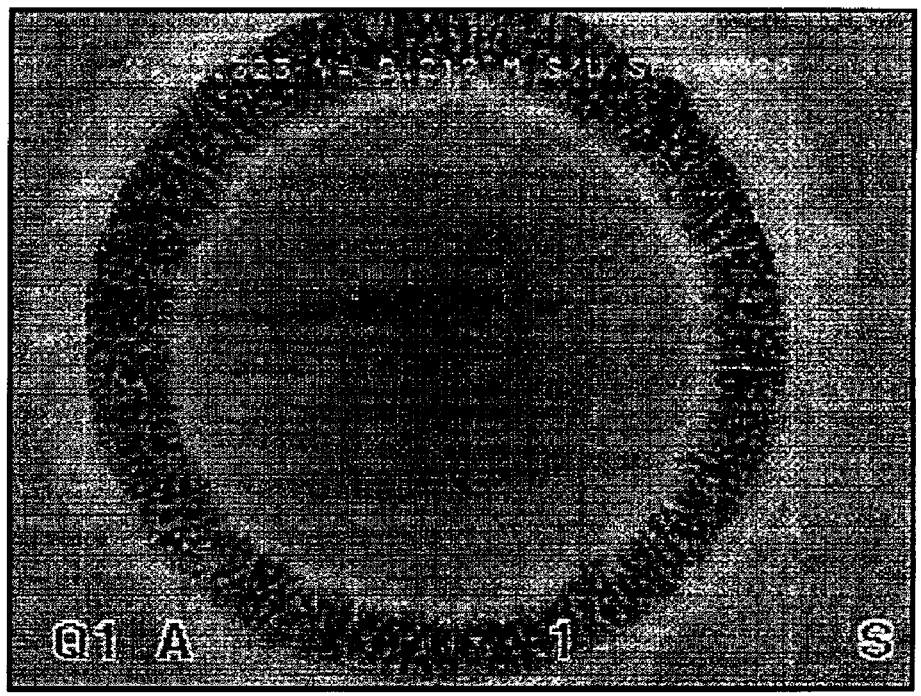
FIG. 7 is an electron micrograph showing a top view of a copper electroplated bond pad in accordance with the teachings herein (the center is blurry because it is out of the focus field of the objective lens in the scope)

FIG. 7 shows a top view of an actual UBM structure formed in accordance with the procedure described above. As shown in this micrograph, the UBM is designed such that a solder ball placed on the UBM will completely overlap the lip of the UBM upon reflow, thus locking the solder ball into place.

Figure 8:
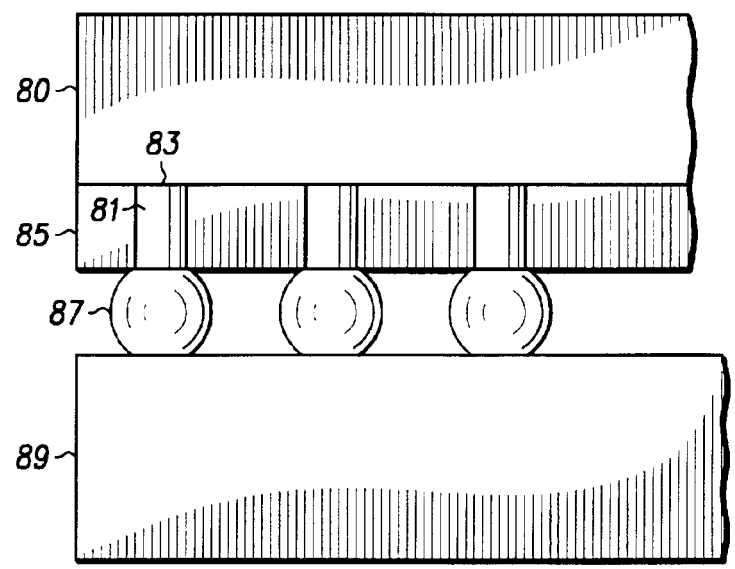
FIG. 8 is an illustration of one embodiment of a die attach of the type disclosed herein which utilizes a cylindrical metal stud in combination with a solder ball to attach a die to a substrate.

FIG. 8 illustrates another possible variation of the UBM which may be employed in the methodology disclosed herein for attaching a die 80 to a substrate 89. In this particular embodiment, the UBM takes the form of a simple stud 81 which extends from the die pad 83. Unlike the bowl-shaped or cup-shaped UBM of the type illustrated in FIG. 3, the UBM in this particular embodiment is in the form of a simple metal stud, which preferably comprises copper or a copper alloy. This stud has a height which is substantially greater than the thickness of a conventional UBM. Thus, the metal stud has a height which is typically greater than about 5 microns, preferably greater than about 25 microns, more preferably greater than about 45 microns, even more preferably within the range of about 45 microns to about 75 microns, and most preferably within the range of about 55 microns to about 65 microns. By comparison, as noted previously, prior art UBM devices typically have a minimum (and indeed maximum) thickness of less than a couple microns. The extra height of the stud is found to have a profound effect on package reliability and lifetime.

In some applications, a stud height in excess of 75 microns can be used with beneficial results. Thus, for example, stud heights of about 100 microns or greater have been found to result in improved solder life in comparison to studs of lesser height. However, the additional costs associated with the extra materials and plating times will typically outweigh any improvements in mechanical properties when the stud height exceeds about 75 microns.

The stud depicted in FIG. 8 is embedded in a photo-definable SCL 85, which is preferably an epoxy. In the particular embodiment shown, the stud is flush with the surface of the SCL, though variations of this embodiment are contemplated in which the stud extends somewhat above or below the surface of the SCL. Embodiments in which the stud extends somewhat below the SCL may be useful in some applications in that they facilitate placement of the solder composition 87. The solder composition may have a spherical, or roughly spherical, shape at the time it is positioned on the stud, although solder compositions having various other shapes may also be employed. However, the surface tension of most solder compositions causes them to adopt a roughly spherical shape upon reflow if they are not in contact with a second surface. Such reflow may occur at the time the solder is initially placed on the stud, or may occur at a later point, such as during attachment of the die to a PCB or other substrate 89.

The photo-definable material of the SCL may be masked and etched, or otherwise defined, to impart almost any desired cross-sectional shape to the stud. Thus, for example, the stud may be polygonal (e.g., square or hexagonal) or elliptical in cross-section. Preferably, however, the stud will have a cross-sectional shape which is at least approximately circular.

Figure 9:
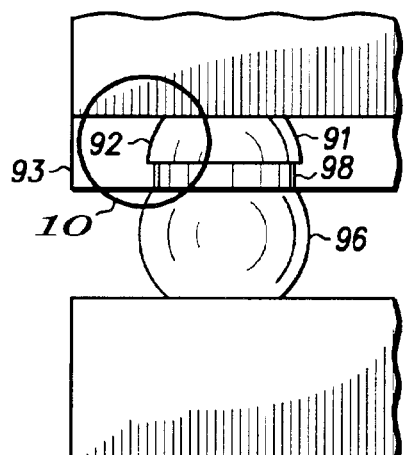
FIG. 9 is an illustration of another embodiment of a die attach of the type disclosed herein which utilizes a frustum-shaped metal stud in combination with a solder ball to attach a die to a substrate.
Figure 10:
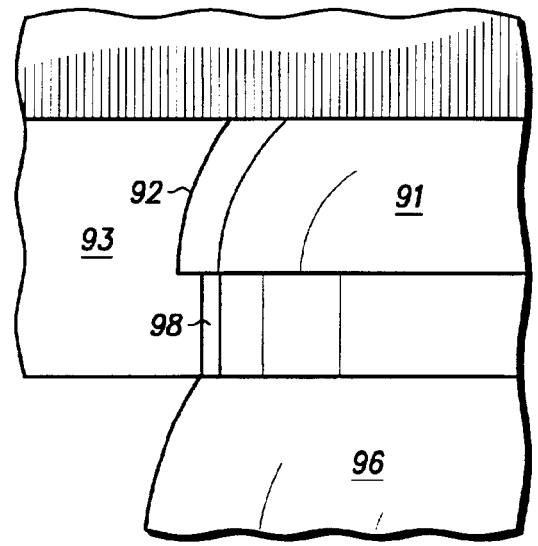
FIG. 10 is a magnified view of REGION 10 of FIG. 9.

FIG. 9 and FIG. 10 (the later of which is a magnified view of REGION 10 of FIG. 9) depict a variation of the stud depicted in FIG. 8. In this variation, the stud 91 is cup-shaped but, unlike the UBM of FIG. 3, is solid (that is, it is not provided with a depression or receptacle), and extends below the surface of the SCL 93. The side 92 of the stud extends outwardly at a slope. This slope, which may be achieved, for example, through the use of appropriate masking, development or etching of the SCL, will typically fall within the range of about 20 to about 90, preferably in the range of about 30 to about 60, and more preferably within the range of about 30 to about 45. Upon reflow, the solder composition 96 flows into the space between the surface of the stud and the surface of the SCL, thus forming a conical neck 98 of solder which extends below the surface of the SCL and contacts the stud.

The UBM structures described above in reference to FIGS. 8–10 can be realized from a processing standpoint by using a number of different approaches. In one such approach, the wafer is sputtered with TiW and then Cu to form a seed layer. In the particular embodiment depicted in FIG. 3, this occurs after the formation of the BCB and SCL layers and the definition of the opening, though in the embodiment depicted in FIG. 8, the TiW and Cu layers may be formed directly on the die bonding pad or wafer surface. A thick layer of photoresist is then applied on top of the seed layer. The photoresist is exposed to light using a photo mask, and is developed to form holes or vias. The wafer is plated with Cu for an extended period of time, resulting in a bowl-shaped UBM (in the case of the embodiment of FIG. 3) or in tall copper studs (in the case of the embodiments of FIGS. 8–10). The height of the copper UBM can be varied by controlling the plating time, but will preferably be about 60 microns. Eutectic solder can be plated on top of the copper, or else a solder ball can be positioned over the copper. If plating is used to deposit the solder, the plating time can be manipulated to give a solder deposit of the desired thickness. After solder plating, the resist may be stripped off as, for example, by dissolving it in hot N-methylpyrrolidone (NMP) solvent. The TiW/Cu seed layer around the Cu stud bump may be etched off using $H_2O_2/NH_4OH$ solvent mixtures or other suitable etches. If desired, a flux may be applied on the solder, and the wafer may be reflowed at solder reflow temperatures to yield a spherical bump. In many cases, the solder may be conveniently reflowed at temperatures greater than about 20 C above the melting point of the solder (in the case of eutectic solders), or at temperatures greater than about 20 C above the upper end of the melting range (in the case on non-eutectic solders).

In another approach, a photo-definable epoxy is coated onto the wafer as a stress compensation layer (SCL). This may be accomplished, for example, by screen-printing the epoxy onto the wafer using a metal mask to yield the desired thickness. The SCL is then gelled and cured. The cured SCL is photo-patterned with UV light using a mask to expose the bonding pads on the wafer. The wafer is then coated with sputtered layers of TiW/Cu films to form a bus metal. A thin layer of photo resist is spin coated on top of the bus metal, and is then cured. The resist is then patterned with UV light using a photo mask, and is developed with solvents to expose portions of the bus metal connected to the bond pads within the vias of the SCL. The vias are plated with Cu for extended periods of time to yield tall copper studs. The height of the Cu studs can be conveniently controlled as a function of plating time. Thus, for example, the height of the Cu studs can be increased by increasing the plating time.

Of course, this procedure may be modified slightly through appropriate definition of the photo resist if a UBM structure of the type depicted in FIG. 3 is desired instead of a stud-shaped UBM structure. An example of such a modified methodology is illustrated in FIGS. 20–26, it being understood that many variations of this embodiment exist. This particular methodology is useful for forming solder bumps on a device designed for wire bonding, a situation that often requires redistribution of the bond pads.

Figure 20:
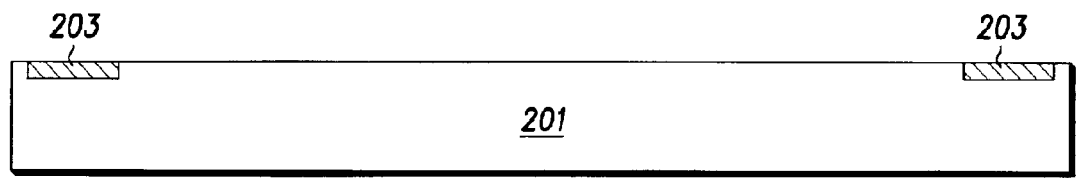
FIGS. 20–26 are illustrations of a methodology for making an under bump metallization layer in accordance with the teachings herein.
Figure 21:
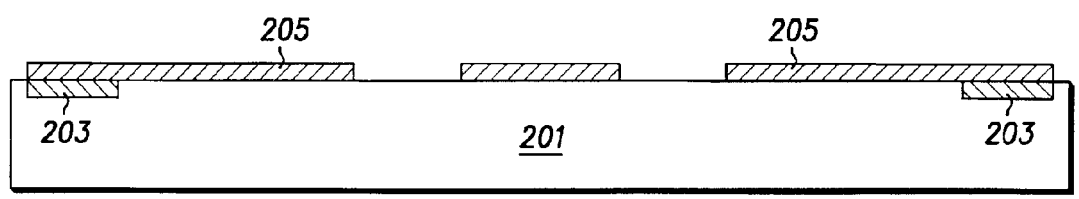
Figure 22:
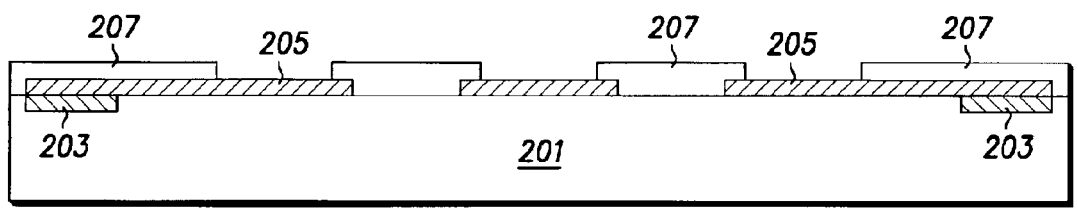

With reference to FIG. 20, a die 201 having peripheral bond pads 203 thereon is provided. In order to provide for proper placement and pitch of the solder bumps that are to be introduced at a later stage, the metal bond pads are redistributed to form the redistributed bond pads 205 shown in FIG. 21. An optional redistribution dielectric 207, which may be, for example, a material such as BCB, is then deposited between, and partially over, the redistributed metal bond pads as shown in FIG. 22.

Figure 23:
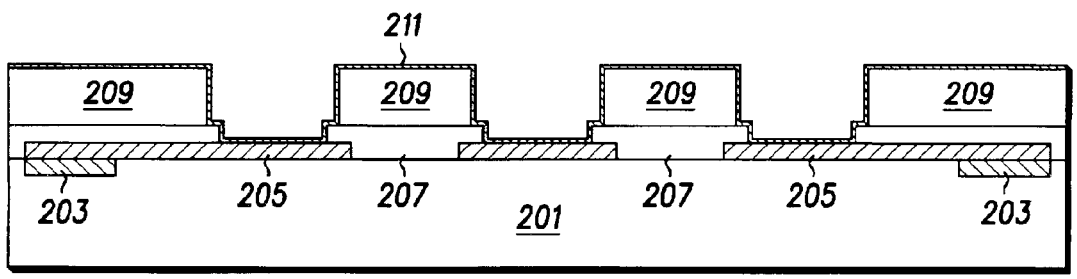
Figure 24:
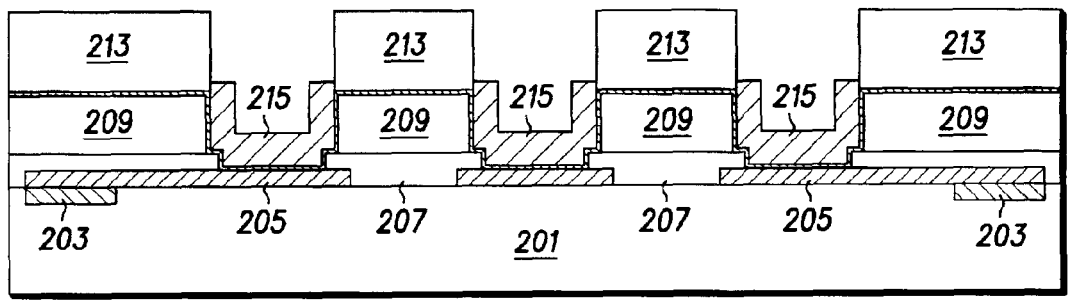
Figure 25:
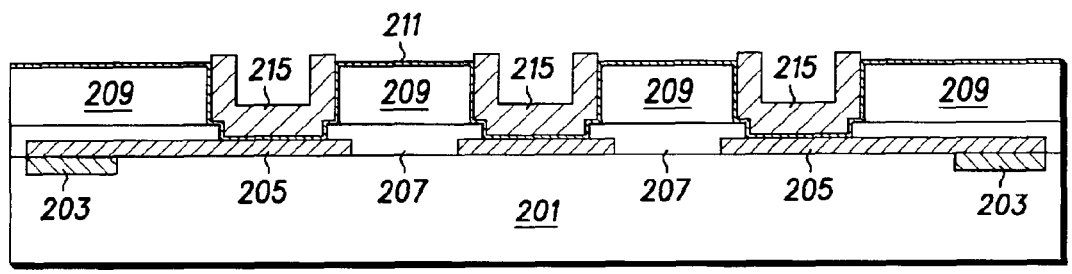
Figure 26:
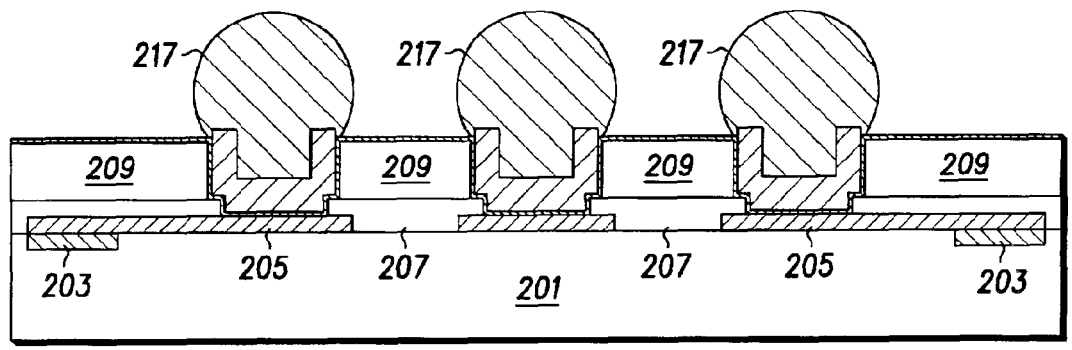

As shown in FIG. 23, a photodefinable encapsulation layer 209, which may be, for example, an SCL, is coated onto the die substrate and patterned, after which a TiW:Cu seed layer 211 is sputtered onto the resulting article. In a structure such as that depicted in FIG. 3, the TiW and Cu layers are deposited after the formation of the BCB and SCL layers and the definition of the opening, though in a structure such as that depicted in FIG. 8, the TiW and Cu layers may be formed directly on the die bonding pad or wafer surface. A layer of photoresist 213 is then coated and patterned over the seed layer as shown in FIG. 24, and the UBM 215 is formed over the exposed seed layer by electroplating with a copper solution. As shown in FIG. 25, the photoresist is then stripped, through the application of a solvent or by other suitable means, and the Cu and TiW are etched to electrically isolate each bond pad. If desired, however, and if the layer of photo resist is sufficiently thick, it may be removed after solder placement and reflow, again by chemical stripping or by other suitable means. FIG. 26 depicts the structure as it appears after solder placement and reflow. A suitable flux may be used to prepare the surface of the UBM for solder application. The solder composition may then be applied by a ball drop, screen printing, or by other suitable methodologies. The solder composition is then reflowed to yield the solder bumps 217. The resulting structure may then be cleaned and cured as necessary.

The processes described above are very clean and compatible with wafer processing. The placing of the solder bump on the Cu stud or UBM can be accomplished through standard, well-known processes and hence has a good yield. Since there is no molten solder extrusion into any voids or cracks as may exist in the SCL, no solder migration or electrical failures occur. There are also no adhesion issues between the SCL and Cu stud. These processes are inherently less costly than existing double bump designs or approaches, and provide low cost, high reliability wafer level packages. These processes also provide a way to deliver a known good package using manufacturing processes compatible with wafer processing and done on the full wafer.

Some of the concepts and considerations disclosed herein will now be illustrated with respect to the following non-limiting example. This example makes reference to the Photo First Approach and SCL First Approach for forming UBMs, which are described briefly below.

Photo First Approach

In this approach, so called because the shape of the UBM is defined primarily by a photoresist layer, a wafer is sputtered with TiW/Cu to form a seed layer. A thick photoresist is applied on top of the seed layer. The resist is exposed to light using a photo mask and developed to form openings to the bond pads. The wafer is plated with Cu for an extended period of time resulting in tall copper studs. The height of the Cu stud can be controlled by the plating time. Eutectic solder can be plated on top of the copper or a solder ball can be placed on top. Increasing the plating time forms thick solder. After solder plating, the resist is stripped off by dissolving in hot NMP solvent. The TiW/Cu seed layer around the Cu stud bump is etched off using $CuSO_4$ and $H_2O_2/NH_4OH$ solvent mixtures. Flux is applied on the plated solder and the wafer is reflowed at solder reflow temperatures to yield a spherical bump.

SCL First Approach

In this approach, so called because the shape of the UBM is defined primarily by the SCL, a photo definable epoxy is coated onto a wafer to serve as a Stress Compensation Layer (SCL). This is achieved by screen-printing on top of the wafer using a metal mask to yield a layer of the epoxy having the desired thickness. The SCL is then gelled and cured. The cured SCL is photo-patterned with UV light using a mask, thus exposing the bond pads on the wafer. The UBM is formed on the bond pads by electroplating. The wafer is coated with sputtered layers of TiW/Cu films to form a seed layer or bus metal. A thin layer of photo resist is spin coated on top of the bus metal and cured. The resist is selectively exposed to UV light using a photo mask and developed with solvents to expose the metal pads within the photo resist openings formed over the SCL cavities. The cavities are plated with Cu for extended periods of time to yield tall copper studs. Increasing the plating time can increase the height of the Cu stud. The photo resist is then stripped. The procedure for forming the solder bump is the same as in the Photo First Approach described above.

EXAMPLE 1

This example illustrates the increase in lifetime and strain distribution afforded by solder joints made in accordance with the teachings herein.

The virtues of a variety of solder joints and UBM designs were explored by subjecting the designs to a finite element analysis using a 2-D plane strain approach. This type of analysis is described in detail in O. C. Zienkiewicz, "The Finite Element Method" ($3^{rd}$ Ed. 1977). Other, more elaborate and time intensive analyses can also be performed for this purpose, and some of these analyses can afford somewhat greater accuracy in certain situations. These include, for example, 3-D non-linear finite element methods. However, the use of a 2-D plane strain non-linear finite element approach here greatly simplifies the model while providing decent comparative results.

The designs were also studied using a global model-submodel approach, which enables the evaluation of the detailed stress distribution in the under bump metallurgy and the under lying silicon super-structure. This type of analysis is also described in detail in O. C. Zienkiewicz, "The Finite Element Method" ($3^{rd}$ Ed. 1977).

The test package used for comparison of different packaging options was as follows:
die size: 4.85 mm×4.85 mm×0.625 mm;
board dimensions: 5.8 mm×5.8 mm×0.54 mm;
the package was assumed to have a 64 area array I/O;
all packages were considered have the same die and board and their performance was compared for a temperature cycle with a low point of −55° C. and a high point of 125° C. with a 10-minute ramp and a 10-minute dwell.

Figure 17:
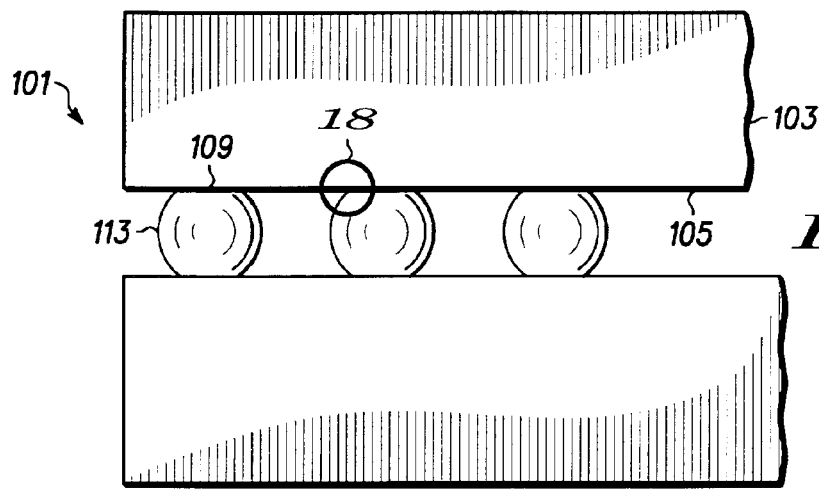
FIG. 17 is an illustration of a prior art DCA package design.

The base line model (i.e., the model against which all other packages were compared) was the direct chip attach (DCA) package of the test die and board without any underfill. This model, which is depicted in FIG. 17, is also frequently referred to as a single ball WLCSP. It is different from the traditional peripherally bumped DCA in that a redistribution layer is provided to fan out the peripheral bumps to a board-friendly area array. This model was chosen as the baseline in part because many customers require a die that does not require underfilling.

Figure 18:
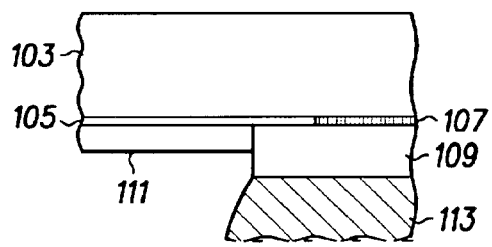
FIG. 18 is a magnified view of REGION 18 of FIG. 17.

The UBM details of the DCA model of FIG. 17, and specifically REGION 18 of that figure, are shown in greater detail in FIG. 18. As seen in these figures, the DCA structure 101 consists of a die 103 having a die pad 107 disposed thereon. A passivation layer 105 is disposed around the die pad, and a UBM 109, which is partially encapsulated in BCB

111 and which is assumed, for the purposes of modeling, to be about 2 mils thick, is disposed on the die pad. A solder ball 113 is disposed on the UBM and is used to attach the die to a PCB substrate.

Figure 19:
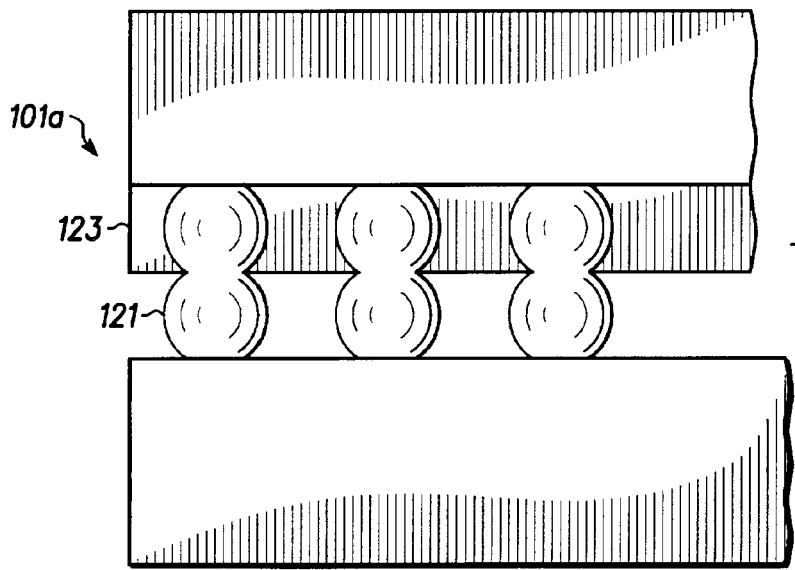
FIG. 19 is an illustration of a prior art double bump chip package design.

The proposed designs were also compared with a known double bump WLCSP 101a depicted in FIG. 19. The details of the UBM in the device of FIG. 19 are similar to those shown in FIG. 18 for the DCA. Beyond the provision of a second solder ball 121, the UBM structure of the device of FIG. 19 differs from that of the DCA model of FIGS. 17–18 primarily in the provision of an SCL layer 123 in the vicinity of the joint between the UBM and the solder ball.

Figure 11:
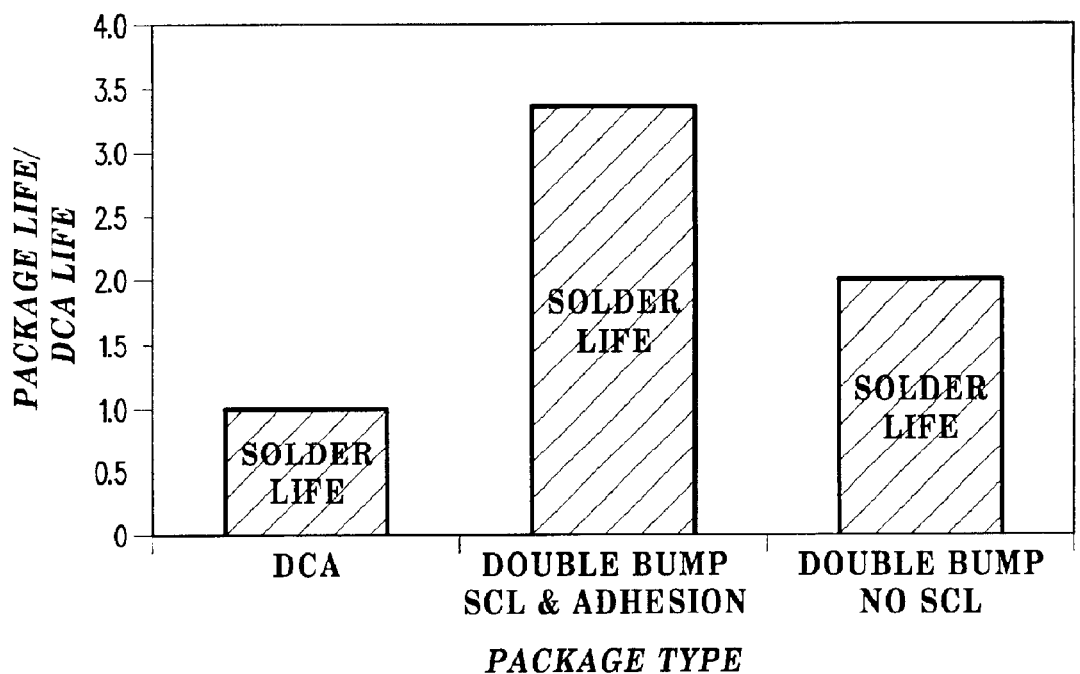
FIG. 11 is a graph illustrating the relative predicted solder life of three different package designs.

FIG. 11 is a graph which compares the predicted life of the double bump WLCSP 101a (see FIG. 19) with the DCA structure 101 (see FIG. 18). In this figure and subsequent figures depicting the effect of various features on life, the life predicted by the model has been normalized with the DCA life. As indicated in FIG. 11, the double bump structure with the fully adhering SCL in addition to the other layers noted above will have a predicted life of about 3.2 times that of the DCA package. If the double bump structure were assembled without the SCL, then the life of this package would be about twice that of the DCA. Hence, the model suggests that the increase in life due to solder stand-off alone is about twice that of the DCA structure. The model also illustrates the beneficial effect of the SCL. Since the model indicates that the double bump structure with the fully adhering SCL will have the best package life, this package will serve as the standard to which some of the packages made in accordance with the teachings herein will be compared in subsequent examples.

Figure 12:
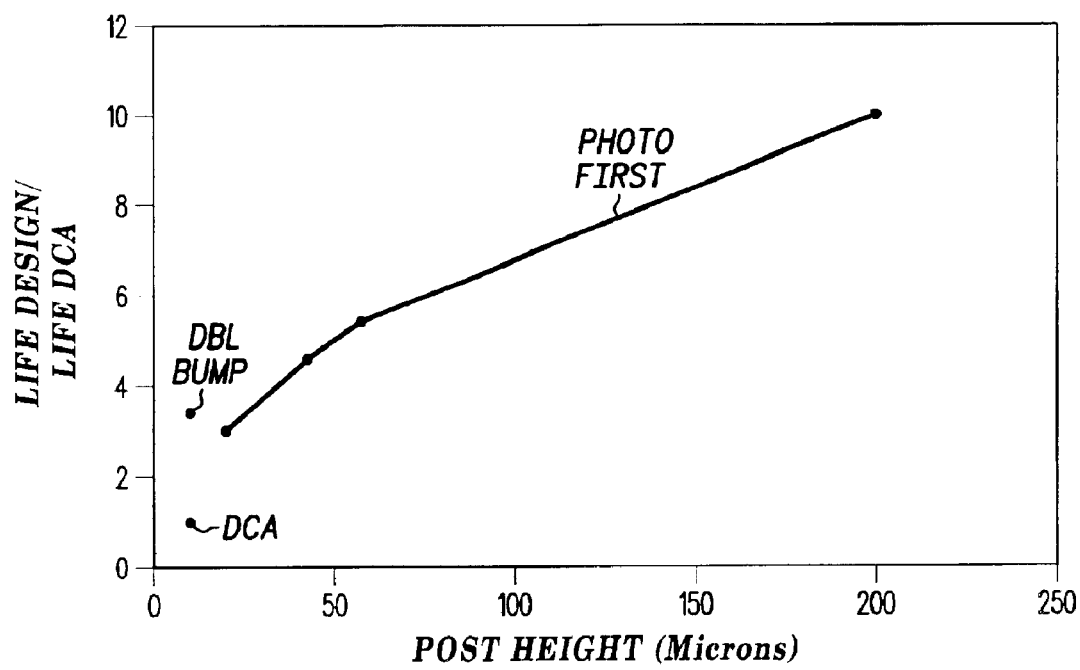
FIG. 12 is a graph of predicted solder life (normalized to the DCA design) as a function of post height.

The predicted life comparison of the proposed "photo first" embedded Cu post design (of the type depicted in FIG. 8) as a function of the post height is given in FIG. 12. FIG. 12 illustrates the enhanced reliability of the proposed photo first design over the double bump structure with the fully adhering SCL which, as previously noted, exhibited the best life among the three prior art packaging systems modeled in FIG. 11. Even for a post height of 40 microns, the expected lifetime for the photo first device is noticeably greater than that of the double bump with fully adhering SCL.

Figure 13:
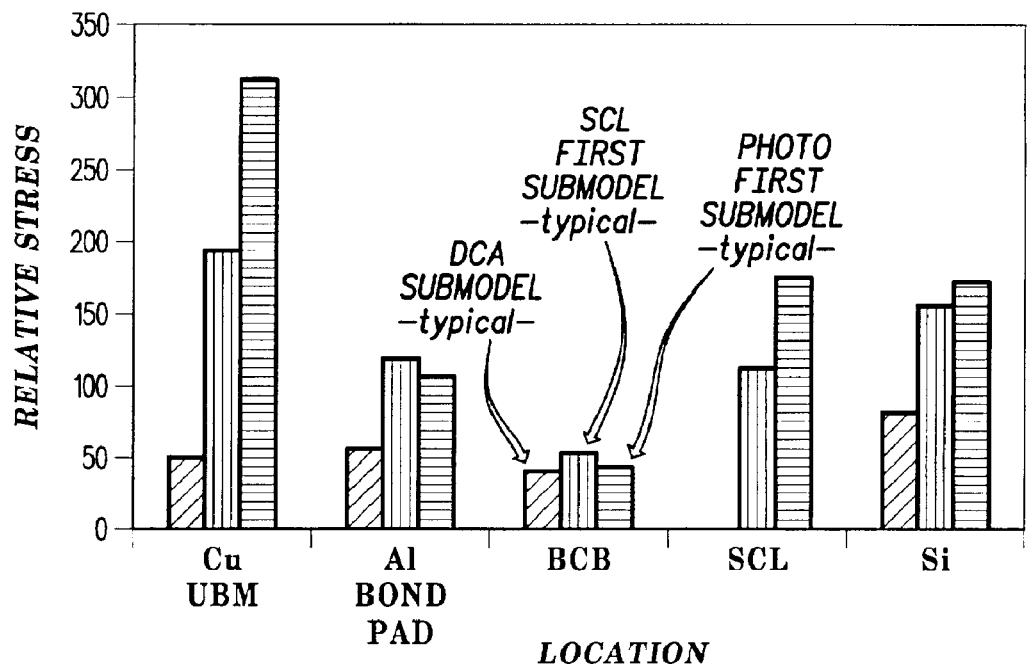
FIG. 13 is a graph of the predicted maximum stress at various locations in three different chip packages.

In general, while reliability (as measured by the expected life of the design) increases with post height, stress also increases with post height. To assess the trade-off for this increase in reliability, the sub-modeling approach was used to determine the maximum stress distribution in the UBM and the silicon substrate. FIG. 13 gives the comparative maximum principal stresses in the UBM and the underlying structure for three different designs (photo first, SCL first, and DCA). The photo first and SCL first designs chosen were modeled with the worst case 100 microns thick embedded copper posts.

The improved lifetimes seen in packages made in accordance with the teachings herein were surprising, especially since some of these designs (at least when modeled with the worst case 100 microns thick embedded copper posts) are predicted to have somewhat greater principle stress than some of the prior art packages modeled in FIG. 11. Thus, as seen in the graph of FIG. 13, the baseline DCA structure is actually predicted by the model to have the least principle stress in the UBM or the underlying silicon structure when compared to the worst case examples of the other two packages. This is followed by the SCL first design made in accordance with the teachings herein, while the photo first design, also made in accordance with the teachings herein, is predicted to have the greatest internal stress of the three packages modeled in FIG. 13. One possible reason for the improvement in expected life, notwithstanding the increase in principle stress, is that all the stresses appear to be below failure-inducing stress levels for the components. The stress in the copper post suggests plastic deformation of the post, but the amount of plastic deformation was small. Thus, even in the worst case scenario with 100 microns thick embedded copper posts, the proposed designs made in accordance with the teachings herein are attractive from a manufacturing standpoint.

Figure 14:
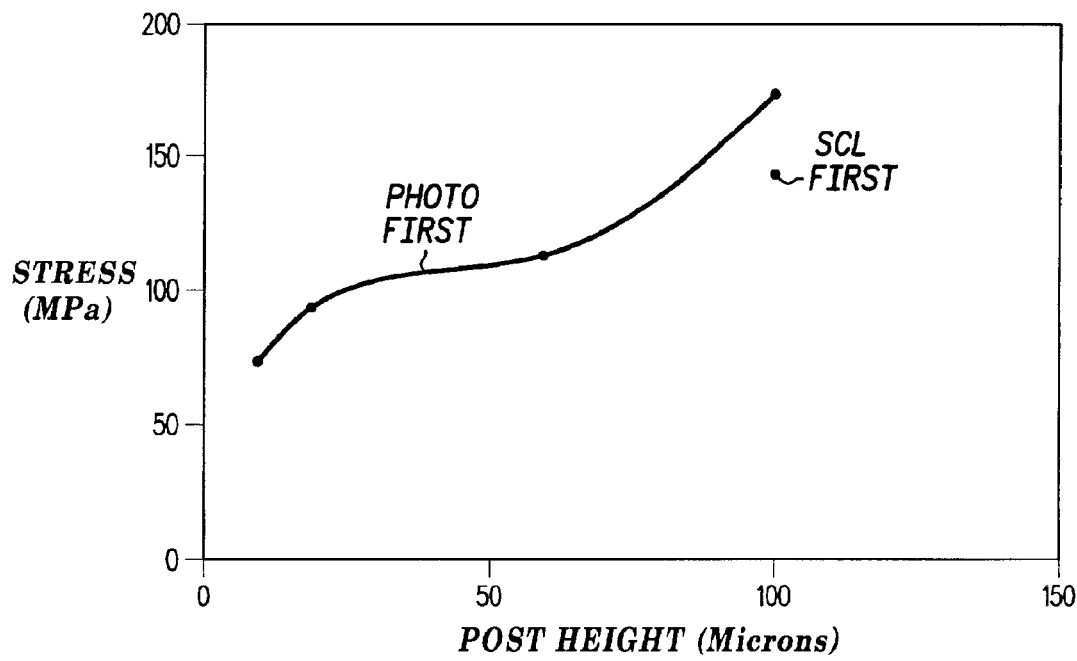
FIG. 14 is a graph of predicted silicon stress as a function of post height for two different chip packages.

FIG. 14 shows the maximum principal stress in the silicon for the photo first WLCSP design made in accordance with the teachings herein as a function of the embedded post height. A data point for a 100 micron SCL first design is also presented for comparison. As this graph indicates, the stress in the silicon can be reduced significantly by reducing the height of the copper post. A copper post height of 40 to 60 microns was found to provide a very attractive life, while substantially reducing the stress in the silicon as compared to the "worst case" 100 microns post height examples modeled in FIG. 13.

Figure 15:
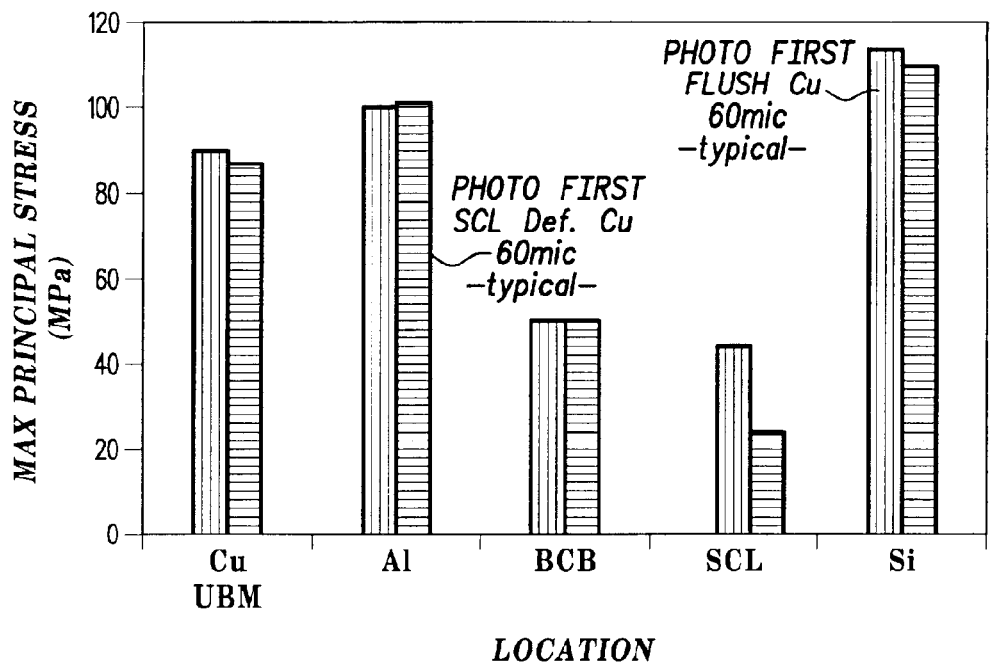
FIG. 15 is a graph of predicted maximum principle stress at various locations in two different chip packages.

FIG. 15 shows the comparison of the stresses for the photo first embedded Cu post structure (assuming a flush Cu post design) and the SCL first design. The stresses in the UBM and silicon are similar for the two designs. From a solder life standpoint, the photo first design is preferable. However, other factors, such as ease of manufacturing and corresponding yield issues, may determine the optimum design for a particular application.

Figure 16:
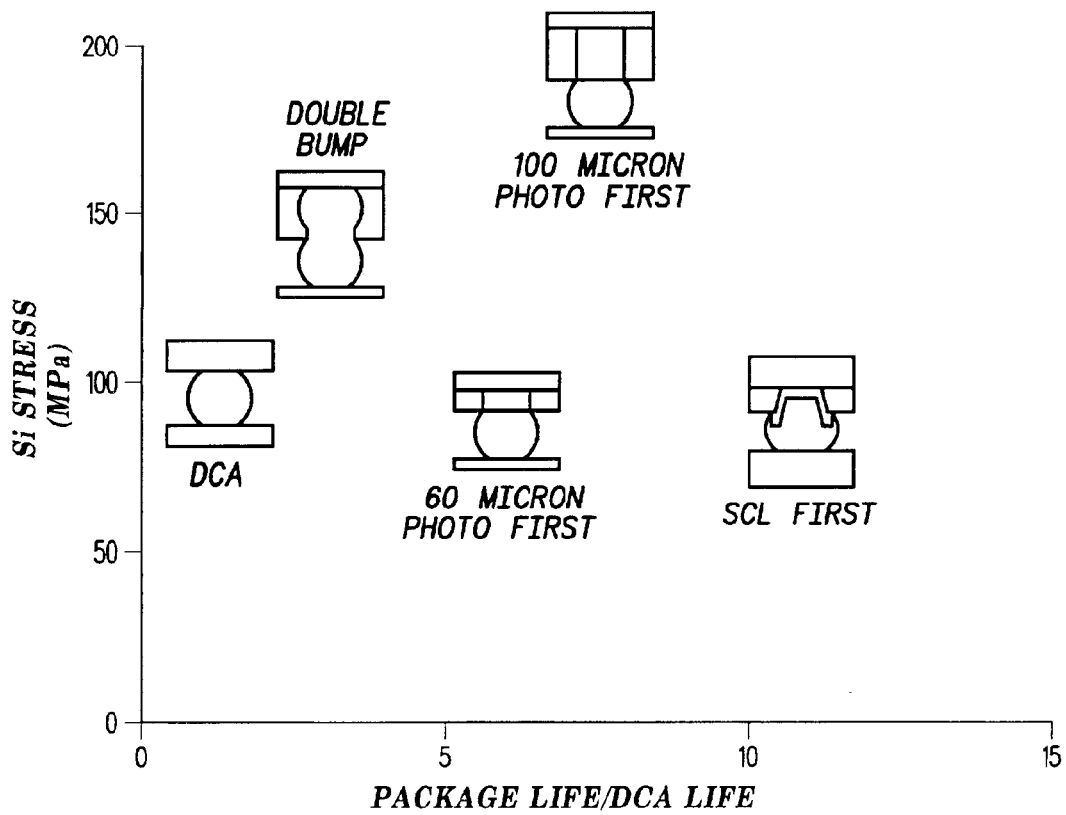
FIG. 16 is a graph of predicted silicon stress as a function of package life (normalized to DCA package life) for five different package designs.

As the results of the previous figures indicate, it is not always possible to optimize one design characteristic without adversely affecting another design characteristic. Thus, for example, a design might have very high solder joint reliability but, because of the high stresses in the UBM structure, it might be prone to material failure. A good way of comparing such diverse designs is shown in FIG. 16. There, the y-axis is the stress in a representative component of the design. Thus, in this particular example, the maximum principal stress induced in the silicon due to the UBM design is chosen as the representative stress. The x-axis is the ratio of the predicted package life with respect to the predicted life for the DCA package with no underfill. Thus, in this representation, the best design should be in the lower right hand quadrant, a design that has low stress and yet a high life. As indicated in this graph, the best design from these considerations is the SCL first design, followed by the 60 micron Cu post photo first design. Similar graphs could be constructed for the maximum principle stress in other locations in the package.

As indicated by this analysis, the packages proposed herein are predicted to have a higher life and are less expensive and easier to manufacture than conventional double bump wafer level packages. They also overcome the drawbacks of the double bump design. With the same size solder bump as the second bump in the double bump structure, the predicted life of the proposed designs is nearly two to three times better than the double bump WLCSP and can be nearly a magnitude better than the DCA package.

Thus far, the details of some specific embodiments of the structures and methodologies disclosed herein have been described. However, a number of variations in different features of these methodologies and structures are possible. Some of these possibilities are described below.

A. Solders

A variety of solders may be used in conjunction with the structures or methodologies disclosed herein. Useful solders include both eutectic and non-eutectic solders, and may be in the form of solids, liquids, pastes or powders at room temperature. Such solders may be based on a variety of materials or alloys, including Sn—Pb, Sn—Pb—Ag, Sn—Ag—Cu, Sn—Ag, Sn—Cu—Ni, Sn—Sb, Sn—Pb—Ag—Sb, Sn—Pb—Sb, Sn—Bi—Ag—Cu, and Sn—Cu. Of these, Sn—Pb and Sn—Cu alloys are especially preferred, the later being particularly desirable in applications where it is desirable to avoid the use of lead (e.g., for health or environmental considerations).

The use of low melting temperature solders in conjunction with the UBM structures disclosed herein is also contemplated. Such low melting temperature solders include those based on indium, gallium, bismuth, and various alloys of these materials, specific examples of which include solders based on Sn—Bi, Sn—Bi—Pb, Sn—Bi—Sb, and Sn—Ag—In—Bi alloys. Many of these alloys are liquid at room temperature, but can be made to react or inter-diffuse with other metals during or after application to yield a solder composition with a much higher melting point or range.

B. UBM Materials

Various materials may be used in the construction of the UBM structures of the type disclosed herein. Pure copper is especially preferred, because it can be readily electroplated using well established methods to almost any desired thickness. Copper structures with inherently low internal stress can be formed by electroplating processes. By contrast, other metals, such as nickel, are found to be more difficult to electroplate to the thicknesses contemplated by the present invention without the occurrence of deformation or structural failure brought about by internal stresses. Copper also readily inter-diffuses with commonly used Sn—Pb solders during reflow to form an inter-metallic zone that reduces fracturing along the solder-UBM interface. Moreover, copper has relatively high tensile strain which ensures that any stress fractures which occur will occur in the solder portion of the solder joint, rather than in the die or UBM structure. To the extent that it occurs at all, it is preferable that joint failure occurs in the solder portion of the joint, where repair may be possible through solder reflow.

In addition to copper and its alloys, a number of other materials may be used in the construction of UBM structures of the type disclosed herein. These materials include Ag, Cr, Ni, Sn, Au, and various alloys of these materials, including alloys of these materials with copper.

In some embodiments of the UBM structures described herein, the UBM may have a monolithic structure, while in other embodiments the UBM may have a multilayered structure. Thus, for example, in some embodiments, the UBM may consist of an adhesion layer, a diffusion barrier layer, and a wetting layer. Specific examples of such multilayered UBMs include, without limitation, Ti/Cu, TiN/Cu, Cr/Ni, Al/Ni—V/Cu, and Cr/CrCu/Cu/Au structures.

C. UBM Shapes

The UBM structures employed in the methods and devices described herein may take on a variety of shapes consistent with the considerations described herein. Preferably, the UBM will have an interior surface that is rounded and bowl-shaped, or is columnar or stud-shaped, and which forms a suitable receptacle for a solder composition. However, the use of a photo-definable SCL as described herein provides for the formation of a wide variety of UBM shapes and dimensions.

D. SCL Materials

Various materials can be used in the Stress Compensation Layers (SCLs) described herein. The material or materials used in this role will have physical properties which serve to protect the chip and package from stress and strain arising from any differences in coefficients of thermal expansion between the semiconductor die and the substrate (e.g., a PCB) to which the package may be attached. The SCL may also serve as a mask or stencil for solder ball placement.

The ability of an SCL material to bond to sputtered metal films such as TiW and/or Cu or to BCB layers may play a role in their selection. It may also be desirable in some situations to have the SCL layer also serve as a passivation layer. Preferably, the material used for the SCL layers in devices made in accordance with the present invention will be a photo-definable polymer of the type described below, though SCL layers based on $Si_3N_4$, SiON, and/or $SiO_2$ may also be used.

E. Photo-Definable Polymers

Various photo-definable polymers can be used in the practice of the methodologies described herein, as the SCL or otherwise. The photo-definable polymer may function as a positive or negative photoresist. Preferably, the photo-definable polymers employed function not only as a masking agent for the UBM, but also function as an SCL, thus enabling them to be used as a photosensitive or photo-definable SCL. In order to function as an effective SCL, it is typically necessary for the SCL to have a Coefficient of Thermal Expansion (CTE) that closely matches that of the adjacent die.

One class of materials that are particularly desirable for use in creating a photo-definable SCL in the practice of the methodologies described herein are the filled epoxies described in commonly assigned U.S. Ser. No. 09/348,737, which was filed on Jul. 6, 1999 and which is incorporated herein by reference in its entirety. These SCLs comprise an epoxy, a diluent, a filler, and a photoinitiator. The epoxy is preferably an aromatic epoxy such as bisphenol A diepoxide or bisphenol F diepoxide. Useful fillers include, for example, borosilicate glass, quartz, silica, and spherical glass beads. Useful diluents include, for example, aliphatic epoxies or cycloaliphatic epoxies which have a lower index of refraction than the aromatic epoxy being used. Thus, for example, if bisphenol F diepoxide is used as the aromatic epoxy, the diluent may be an aliphatic epoxy such as diglycidyl-1,2-cyclohexanedicarboxylate, limonene oxide, 3,4-epoxycyclohexylmethyl 3,4-epoxycyclohexane carboxylate, or partially acrylated bisphenol F diepoxide. The photoinitiator is preferably a cationic photoinitiator and may be, for example, a mixture of an onium salt, such as a triarylsulfonium hexafluorophosphate salt, and a solvent, such as propylene carbonate. A mixture of bis-p-diphenylsulfoniumphenylsulfide hexafluorophosphate and diphenylphenylthiophenylsulfonium hexafluorophosphate is preferred for use as the triarylsulfonium hexafluorophosphate salt.

Various other photo-definable polymers can also be utilized in the practice of the present invention. These include, without limitation, Probelec® XB 7081, an epoxy-based photosensitive permanent resist having a low dielectric constant which is commercially available from Ciba Geigy Corporation (Basel, Switzerland), and selected polyimides. Both of these materials may be used with the fillers noted above, or with other suitable fillers.

F. Passivation Layers

Various materials may be used as passivation layers in the devices and methodologies described herein. Passivation layers serve to protect the wafer from damage during processing. The passivation layer also serves to isolate the active sites on the wafer. It is preferred that the passivation material be a photo definable material such as BenzoCycloButene (BCB), since this allows the use of photolithographical techniques to expose the die pad. BCB is available commercially, for example, from the Dow Chemical Company (Midland, Mich.) under the trade name Dow Cyclotene® 4024. Other suitable materials for use in the passivation layer include, but are not limited to, polyimides, silicon nitride, and silicon oxide.

G. Adhesion Layers/Bus Layers

A variety of materials and combinations of materials may be used in the practice of the methodologies described herein to facilitate adhesion of the UBM to the SCL. The material or materials used for this purpose may also serve other functions, such as providing a seed layer or bus metal layer for electroplating operations used to form the UBM. Preferably, the adhesion layer comprises a first layer of TiW, which may be sputtered or otherwise deposited over the surfaces of the SCL and the opening used to define the UBM, and a second layer of copper or a copper alloy which is sputtered or otherwise deposited over the TiW layer. The thicknesses of these two layers may vary. Typically, however, the TiW layer has a layer thickness within the range of about 50 nm to about 200 nm, preferably within the range of about 75 nm to about 125 nm, and more preferably within the range of about 90 nm to about 110 nm. Most preferably, the TiW layer has a thickness of about 100 nm. The Cu or Cu alloy layer typically has a thickness within the range of about 200 nm to about 800 nm, preferably within the range of about 300 nm to about 700 nm, and more preferably within the range of about 400 nm to about 600 nm. Most preferably, the Cu or Cu alloy layer has a thickness of about 500 nm.

H. End Uses

The UBMs described herein, and the soldering processes that make advantageous use of them, may be employed in a variety of end use applications. One area of particular interest is the use of these UBMs and soldering methodologies in electronic packaging applications, such as Wafer Level Chip Scale Packaging (WLCSP). WLCSP is chip sized packaging based on wafer level processes that is built entirely in the wafer fab. The resulting package is fully testable and, when constructed in accordance with the principles disclosed herein, does not require any substrate interposer or underfill operations to be performed by the customer. WLCSP provides a low cost packaging option for semiconductor integrated circuits, memory products, and passive devices, and can be directly attached to an end user's board.

As described above, WLCSP can be made in accordance with the present invention using, for example, a tall electroplated copper stud which is capped with a solder ball. Preferably, the stud is encapsulated in an epoxy. The resulting package is found to have a longer life and is less expensive and easier to fill than other commonly used processes in this area, such as double bump wafer level packaging. Moreover, as demonstrated above, WLCSPs made in accordance with the present invention exhibit a predicted life time that is substantially greater than a double bump design utilizing the same size solder balls.

As described herein, various methods have been provided which make advantageous use of a photo-definable polymer to create UBMs of various shapes and dimensions. Various structures that can be made through the use of these methods have also been provided. The photo-definable polymer employed in these methodologies may also serve as an SCL. The methods disclosed herein can be used to create UBMs that are thicker than conventional UBMs, and these thicker UBMs are found to improve some of the mechanical characteristics of the solder joint. The methods disclosed herein can also be used to create UBMs that are bowl-shaped, which facilitates placement of a solder ball on the UBM and also provides for a greater area of contact between the UBM and solder ball. An adhesion or primer layer has also been disclosed, which improves adhesion between the SCL and UBM. These various features, taken alone or in combination, are found to have profound, beneficial effects on package reliability and lifetime.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for creating an under bump metallization, comprising the steps of:

providing a die having a die pad disposed thereon;

forming a stress compensation layer over the die pad, said stress compensation layer having a thickness within the range of about 10 to about 100 microns and comprising a first photo-definable polymer;

masking and exposing the stress compensation layer to create an aperture therein which exposes the die pad;

forming a bus metal layer over the stress compensation layer and within the aperture;

forming a layer of a second photo-definable polymer over the bus metal layer;

masking and exposing the second polymer to create a first region in which the bus metal layer is exposed and a second region in which the bus metal layer is covered by the second polymer, the first region including at least a portion of the aperture; and forming an under bump metallization on the bus metal layer in the first region;

wherein the under bump metallization has a thickness of at least about 20 microns as measured in the center of the aperture along a line orthogonal to the die pad.

2. The method of claim 1, wherein the first polymer is an epoxy.

3. The method of claim 2, wherein the epoxy contains an inorganic filler.

4. The method of claim 3, wherein the filler is selected from the group consisting of borosilicate glass, quartz, silica, and glass beads.

5. The method of claim 1, wherein the second polymer is a photoresist.

6. The method of claim 1, wherein the under bump metallization is deposited via an electroplating process.

7. The method of claim 6, wherein the under bump metallization comprises copper.

8. The method of claim 1, wherein said under bump metallization includes a receptacle for receiving a solder ball.

9. The method of claim 1, wherein the under bump metallization includes a bowl-shaped portion.

10. The method of claim 1, wherein the under bump metallization has a thickness within the range of about 45 microns to about 75 microns as measured in the center of the aperture along a line orthogonal to the die pad.

11. The method of claim 1, wherein the bus metal layer comprises TiW and the under bump metallization comprises Cu.

12. A method for creating an under bump metallization, comprising the steps of:

providing a die having a die pad disposed thereon;

forming a stress compensation layer on or over the die pad, said stress compensation layer comprising a photo-definable polymer and having a thickness within the range of about 10 to about 100 microns;

masking and exposing the stress-compensation layer to create an aperture having at least a portion of a bus metallization layer exposed therein; and forming an under bump metallization on the exposed portion of the bus metallization layer;

wherein the under bump metallization has a thickness of at least about 20 microns as measured in the center of the aperture along a line orthogonal to the die pad.

13. The method of claim 12, wherein the thickness of the stress compensation layer is within the range of about 20 to about 60 microns.

14. The method of claim 12, wherein the thickness of the stress compensation layer is within the range of about 30 to about 50 microns.

15. The method of claim 12, wherein the under bump metallization has a thickness within the range of about 45 microns to about 75 microns as measured in the center of the aperture along a line orthogonal to the die pad.

16. The method of claim 12, wherein the shape of the under bump metallization is determined primarily by the stress compensation layer.

17. The method of claim 1, wherein the shape of the under bump metallization is determined primarily by the stress compensation layer.

* * * * *